United States Patent [19]

Kodato et al.

[11] Patent Number: 5,102,470
[45] Date of Patent: Apr. 7, 1992

[54] ELECTRIC RESISTOR HAVING A THIN FILM CONDUCTOR

[75] Inventors: Setsuo Kodato, Atsugi; Masao Nakamura, Hatano, both of Japan

[73] Assignee: Anritsu Corporation, Tokyo, Japan

[21] Appl. No.: 591,702

[22] Filed: Oct. 2, 1990

Related U.S. Application Data

[62] Division of Ser. No. 216,909, filed as PCT/JP87-00812, Oct. 23, 1987, Pat. No. 4,963,195.

[30] Foreign Application Priority Data

Oct. 24, 1986 [JP] Japan .............. 61-253412

[51] Int. Cl.[5] .............................................. H01L 35/28
[52] U.S. Cl. ..................................... 136/225; 136/239
[58] Field of Search ............ 136/225, 239; 338/22 R, 338/225, 254, 328

[56] References Cited

U.S. PATENT DOCUMENTS

| | | | |
|---|---|---|---|
| 3,824,521 | 7/1974 | Horii et al. | 338/254 X |
| 3,898,080 | 8/1975 | Penn | 75/134 S |
| 3,899,357 | 8/1975 | Rinaldi et al. | 136/121 |
| 4,359,372 | 11/1982 | Nagai et al. | 338/22 R X |
| 4,424,507 | 1/1984 | Nagai et al. | 338/22 R X |
| 4,454,495 | 6/1984 | Werner et al. | 338/22 R X |
| 4,711,971 | 12/1987 | Duncan et al. | 136/211 |
| 4,712,085 | 12/1987 | Miki et al. | 338/22 R X |
| 4,754,254 | 6/1988 | Hosokawa et al. | 338/22 SD X |
| 4,759,905 | 7/1988 | Walter et al. | 419/23 |
| 4,766,008 | 8/1988 | Kodato | 427/39 |
| 4,835,059 | 5/1989 | Kodato | 428/432 |
| 4,968,964 | 11/1990 | Nagai et al. | 338/22 R |

FOREIGN PATENT DOCUMENTS

| | | |
|---|---|---|
| 46-12660 | 4/1971 | Japan . |
| 55-10994 | 3/1980 | Japan . |
| 59-23263 | 2/1984 | Japan . |
| 61-208824 | 9/1986 | Japan . |
| 62-133770 | 6/1987 | Japan . |

Primary Examiner—Peter A. Nelson
Attorney, Agent, or Firm—Frishauf, Holtz, Goodman & Woodward

[57] ABSTRACT

The electric resistor of this invention is comprised of a Si-Ge alloy thin film containing amorphous and microcrystal phases which serve as an electric resistance, thereby keeping the resistance value ratio substantially constant and uninfluenced by frequency changes which range from d.c. to 32 GHz. In addition, the power detector of this invention uses a thermocouple which is made by connecting the conductor film with the above-mentioned alloy thin film having great thermoelectric power. The thermocouple is provided with beam lead electrodes at cold junction areas to thereby produce large temperature differences between the hot and cold junctions, so that the thermocouple is provided with a sufficient thermal gradient to detect very low power with high accuracy.

9 Claims, 9 Drawing Sheets

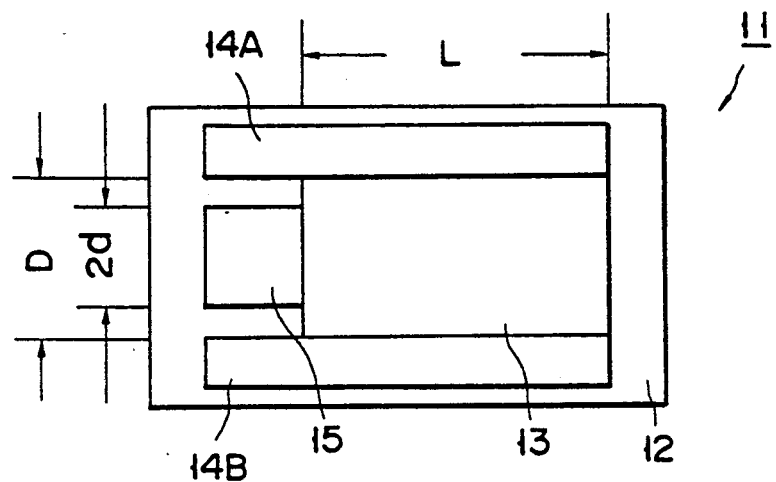
F I G. 1A
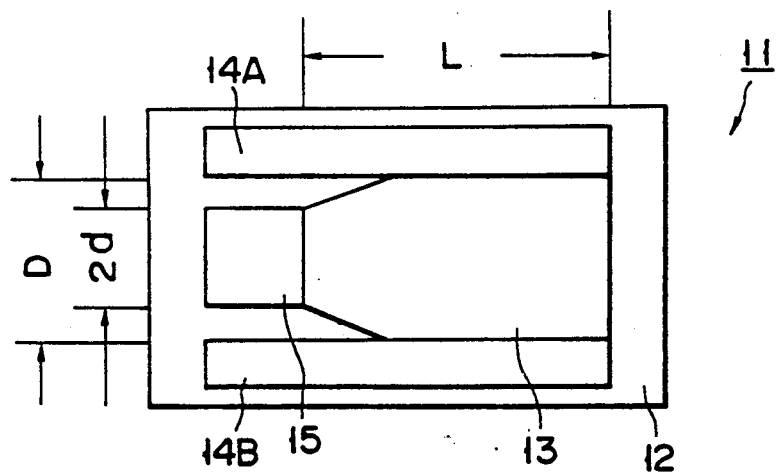
F I G. 1B

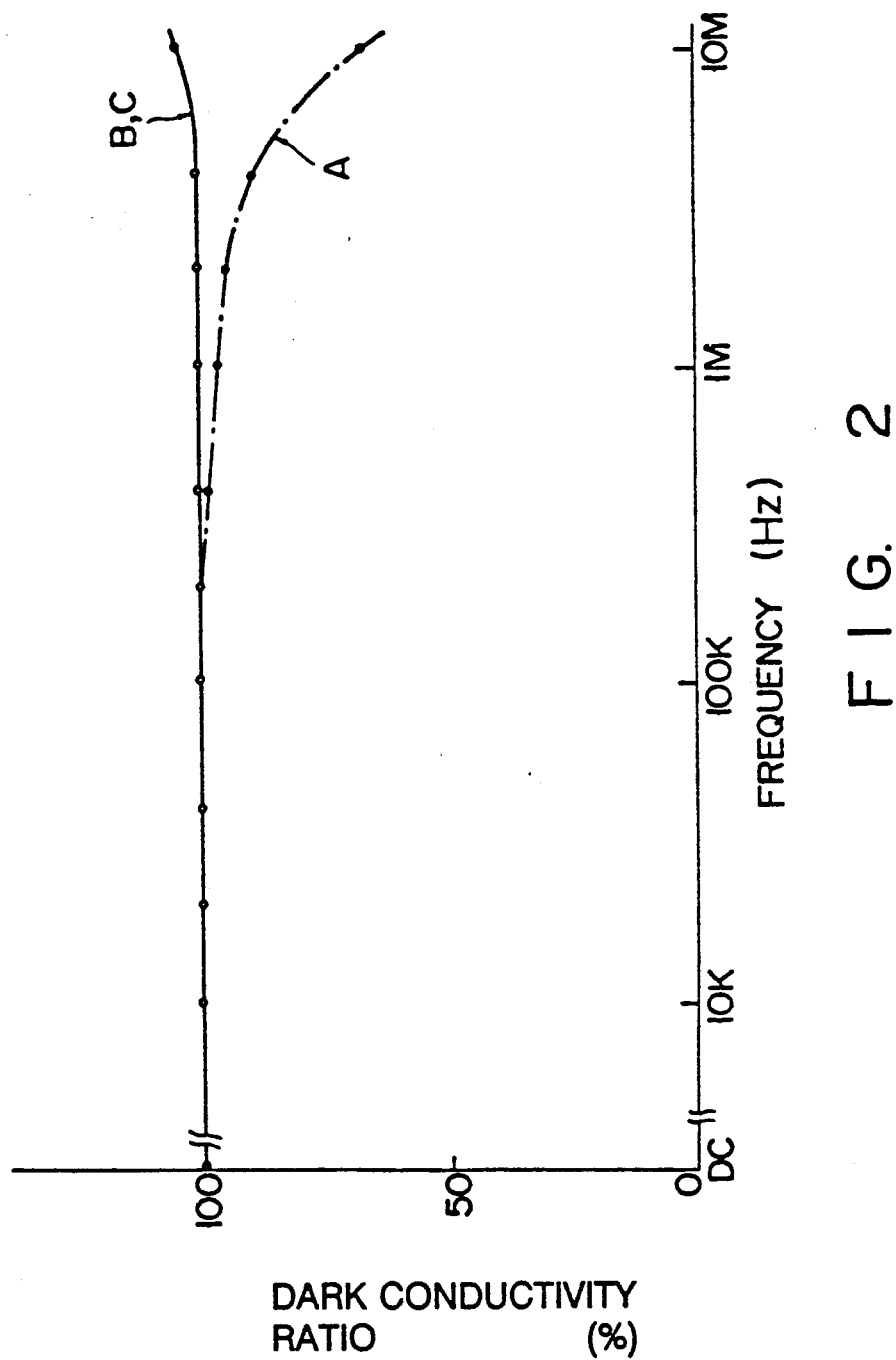

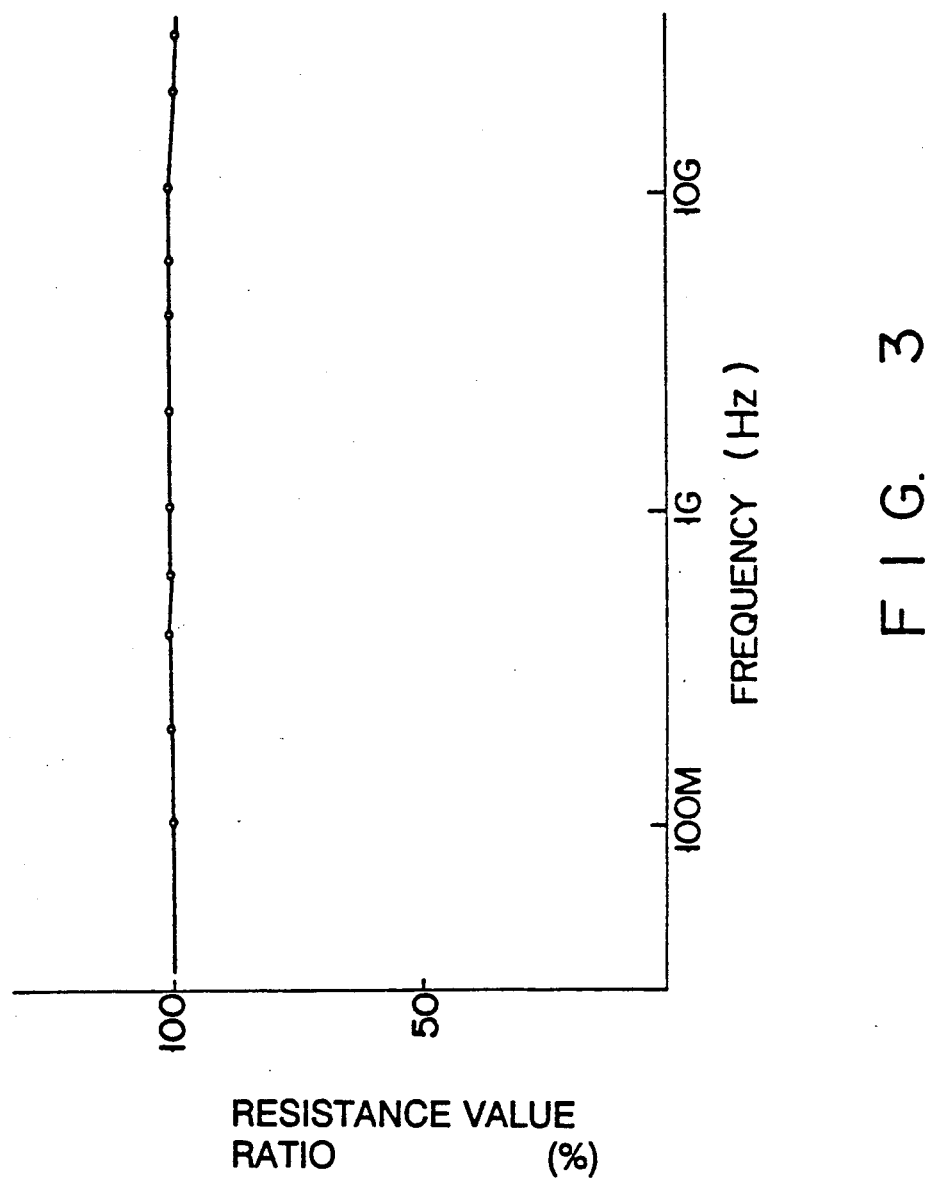

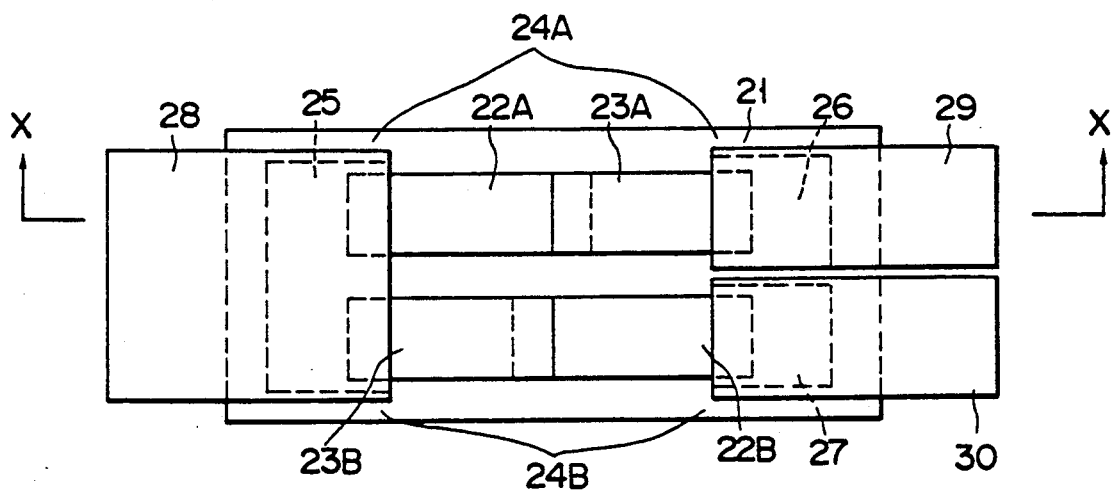
F I G. 6A
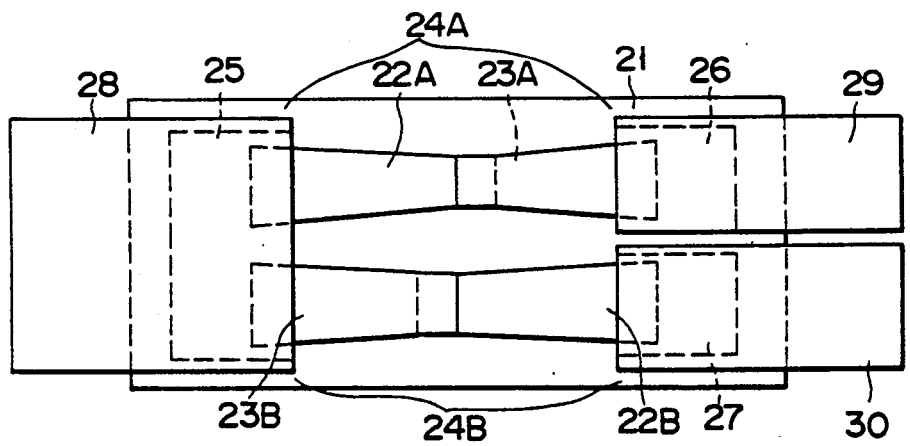
F I G. 6B
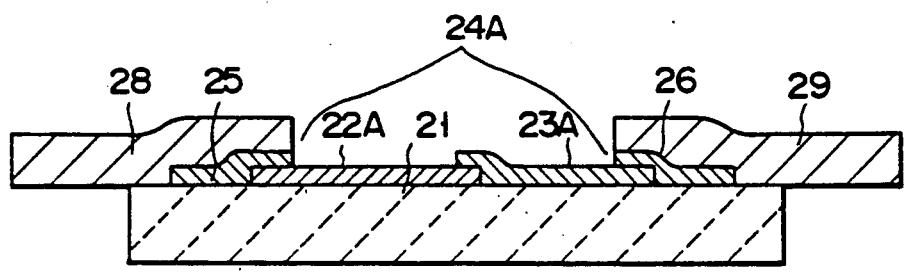
F I G. 7

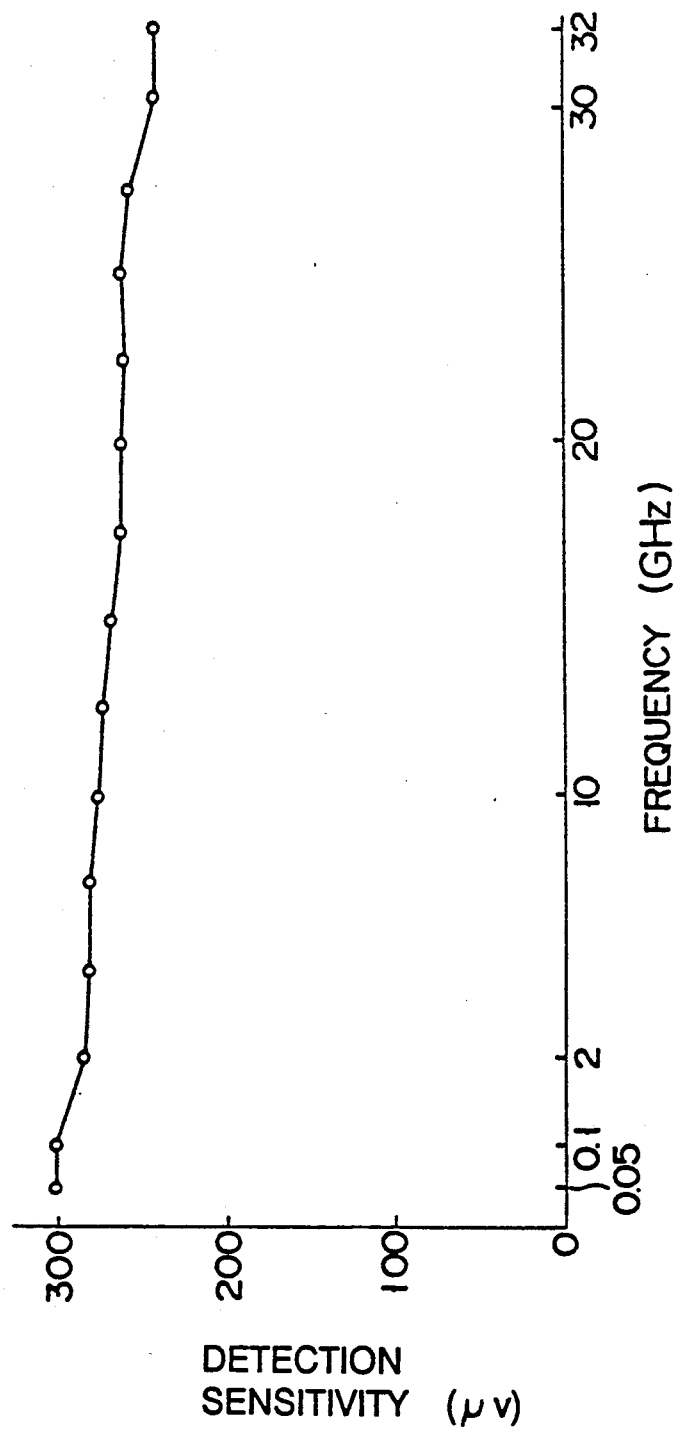
F I G. 12

ELECTRIC RESISTOR HAVING A THIN FILM CONDUCTOR

This is a division of application Ser. No. 07/216,909 filed as PCT/JP87/00812, Oct. 23, 1987, now U.S. Pat. No. 4,963,195.

TECHNICAL FIELD

This invention relates to an electric resistor comprising a thin film conductor for use in electric circuits, and more particularly to an electric resistor which shows excellent impedance matching characteristics in a wide frequency range from direct current to ultrahigh frequencies.

Also, this invention relates to a power detector comprising a thermocouple that is made of a thin film conductor to utilize its great thermoelectric power. It can attain fine impedance matching in the high frequency range. This power detector shows superb linearity in detection sensitivity with respect to incident power in the low power range and is used for power detection from low power to high power.

BACKGROUND ART

A nichrome vaporized film and a tantalum nitride film ar well-known thin film resistor materials in the microelectronics field, used to make electric resistors. These thin films feature the capability of photolithognaphy. However, the surface of a substrate used to form a resistor must be fine-grained since the thickness of the films, with good high frequency characteristics, is about 200 Å. These films have another drawback, in that the film quality deterioration temperature is as low as about 200° C. The low deterioration temperature means that the burnout temperature is low. Therefore, the working environment for electric resistors, using conventional thin film resistance materials, has been limited considerably.

In regards to the power detector, in Japanese Patent Disclosure No. 84-23263 one of the inventors of this invention has disclosed a thermocouple device made by connecting a mixed crystal film of the amorphous and microcrystal phases with a metal resistance film. A power detector using this thermocouple device is quite capable of stable measurement during high power detection. However, this power detector comprising the thermocouple is too low in sensitivity to perform stable measurement and has poor linearity in the theremoelectromotive force of the thermocouple in detecting low power, such as 1 μW for example. U.S. patent application Nos. 896131 (now U.S. Pat. No. 4,835,059) and 068273., (now U.S. Pat. No. 4,766,008) that one of the inventors of this invention have filed, discloses a Si-Ge alloy thin film conductor in which the amorphous and microcrystal phases coexist. This thin film conductor, though made of a semiconductor material, has a relatively large conductivity but the temperature coefficient is small like that of metals and also offers a feature that the thermoelectric power (the Seebeck coefficient magnitude) is large like that of semiconductors; therefore, the thermo-electromotive force is large. In the above patent applications, the applicability to electric resistors and power detectors is indicated.

DISCLOSURE OF THE INVENTION

The first objective of this invention is to provide an electric resistor comprised of a thin film resistor that is superior in its photolithography ability and can be used at high temperatures.

The second objective of this invention is to provide an electric resistor capable of utilizing an insulating substrate, but not necessarily of a fine-grained texture but can consist of almost any optional type material.

The third objective of this invention is to provide an electric resistor which displays the characteristics of being applicable to a variety of frequencies, ranging from direct current to a frequency range of 32 GHz and which is easy to manufacture.

The fourth objecting of this invention is to provide a power detector having improved detection sensitivity and excellent linearity in the low power range.

The fifth objective of this invention is to provide a power detector having improved sensitivity in low power detection.

In order to achieve the first three objectives, this invention uses an alloy thin film conductor chiefly consisting of silicon and germanium. In this conductor the amorphous and microcrystal phases coexist. This invention utilizes the properties of this alloy thin film conductor so that the temperature coefficient of the conductivity is small and the conductivity is substantially constant from direct current to frequencies up to 32 GHz.

The above-mentioned alloy thin film conductor is manufactured using microelectronics processes such as the plasma CVD process and the photo assisted CVD process as indicated in U.S. patent application No. 068273 (now U.S. Pat. No. 4,766,008).

The Si-Ge alloy thin film conductor thus produced has a crystallinity (the proportion of microcrystals to the total) of 10% to 90%. The microcrystals consist of silicon and germanium. The average grain size is about 50 to 500 Å. The conductivity is at least 0.1 S·cm$^{-1}$. The ratio of conductivity change with the measuring frequency is less than 20% (less than 1 dB) from direct current to 32 GHz.

This electric resistor has the above-mentioned thin film conductor, two first electrodes and a second electrode, all arranged on an insulating substrate. The thin film conductor has a trapezoidal portion having two mutually parallel sides and a side at right angles with the two parallel sides. The first electrodes have a rectangular shape longer than the two parallel sides of the thin film conductor. Each of the first electrodes has a portion in contact with the two parallel sides of the thin film conductor and a portion extending beyond the thin film conductor. The second electrode is in contact with the side at right angles with the two parallel sides and arranged between the extended portions of the first electrodes and certain distances from the first electrodes. These electrodes, constituting the input and output terminals of current, are structured to enable the electric resistor to utilize the current transfer phenomenon of the thin film conductor.

The electric resistor in this invention makes it possible to (1) make an electric resistor having a substantially constant resistance value ratio with frequency changes from direct current to 32 GHz;

(2) make an electric resistor which is stable at above 600° C. by using a chrome/platinum multi-layer vaporized film disclosed in Japanese Patent Application No. 60-274390 (corresponding to Japanese Patent Publication (Kokai) No. 62-133770 as the electrodes; and (3) make on an integrated circuit substrate an electric resistor displaying the characteristics applicable from direct current to a frequency range up to 32 GHz.

In order to achieve the fourth and fifth objectives, this invention uses an alloy thin film chiefly consisting of silicon and germanium, in which the amorphous and microcrystal phases coexist for a material constituting one of the thermocouples and utilizes the properties of the alloy thin film that the conductivity is high, the temperature coefficient of the conductivity is small, the thermoelectromotive force is large and the conductivity is substantially constant from direct current to frequencies up to 32 GHz. Since the manufacturing method of the alloy thin film is the same in principle as that of the thin film resistance material for the electric resistor, the manufacturing method of the alloy thin film will not be described here.

In the power detector, a thermocouple is made by connecting the above-mentioned alloy thin film with a conductor film. One or more thermocouples in combination are arranged on an insulating substrate. The alloy thin film in the above-mentioned thermocouple is connected with a first electrode. The conductor film of the thermocouple is connected with a second electrode. The first electrode is connected with a first beam lead electrode and the second electrode is connected with a second beam lead electrode.

The power detector of this invention, makes it possible:

To provide a power detector with improved linearity, particularly in the low power detection range, by furnishing beam lead electrodes thereby increasing the temperature difference between the hot and cold junctions of the thermocouple.

In conventional power detectors using a semiconductor film and a metal resistance film, the upper limit working frequency is 18 GHz, the detectable power range is 10 $\mu$W to 160 mW and the detection response speed is 0.7 sec. In contrast, with the power detector in this invention, because of the use of the above-mentioned alloy thin film and beam lead electrodes, the upper limit working frequency is increased to 32 GHz and the detectable power range is widened from 1 $\mu$W to 500 mW. In addition, since microminiaturized elements can be formed by using micro processing techniques such as photolithography, the detection response speed is reduced to less than 0.06 sec.

It is now possible to provide a less expensive power detector since the structure is simpler than that of the conventional power detector using semiconductor film and metal resistance film.

BRIEF DESCRIPTION OF THE DRAWINGS

FIG. 1A is a top view example of the electric resistor according to this invention;

FIG. 1B is another top view example of the electric resistor according to this invention;

FIG. 2 shows the frequency characteristics of the dark conductivity of the Si-Ge alloy thin film conductor in this invention;

FIG. 3 shows the frequency characteristics of the resistance value ratio of the electric resistor according to this invention;

FIG. 6A shows an example of the power detector of this invention;

FIG. 6B shows another example of the power detector of this invention;

FIG. 7 is a sectional view taken along line X—X of FIG. 6A;

FIG. 12 shows the frequency characteristics of the detection sensitivity at an incident power of 1 mV obtained by the power detector of this invention.

BEST MODE FOR CARRYING OUT THE INVENTION

An embodiment of the electric resistor according to this invention will now be described. The process of depositing Si-Ge alloy thin film conductor by CVD (Chemical Vapour Deposition) is one technique of microelectronics. In this embodiment, a plasma CVD furnace, which is available on the consumer market, is used. Similarly, a thermal CVD furnace or a photo assisted CVD furnace can be used. It is only necessary to use a furnace which is capable of depositing an alloy thin film consisting of a amorphous phase and a microcrystal phase on an insulating substrate. In this embodiment, a p-type film was formed, but an n-type film can be formed by the same process.

Insulating substrates were placed in the furnace, into which a source gas had been introduced. The substrates that can be used for this purpose have an insulating property, at least on the surface, such as a glass substrate, mica, polyimide film, various types of semiconductor substrates and metal plates covered with an insulating thin film. The insulating substrates used in this embodiment do not need to necessarily have a fine-grained surface texture. A mixed gas of saline (SiH$_4$) and germane (GeH$_4$) was used as the source gas introduced into the furnace. Diborane (B$_2$H$_6$) diluted with hydrogen was used as a p-type dopant. An example of depositing conditions is shown in Table 1.

TABLE 1

| Sample No. | 1 | 2 | 3 |
|---|---|---|---|
| Gas flow ratio (SiH$_4$/GeH$_4$) | 1 | 1 | 1 |
| Electric discharge pressure (Torr) | 2 | 2 | 2 |
| Discharge power (W) | 15 | 80 | 300 |
| Discharge power density (W/cm$^2$) | 0.02 | 0.11 | 0.40 |
| Substrate temperature (°C.) | 380 | 380 | 380 |

The characteristics of the thin film conductor thus obtained are indicated in U.S. patent application No. 896131 described previously.

Figure 4:
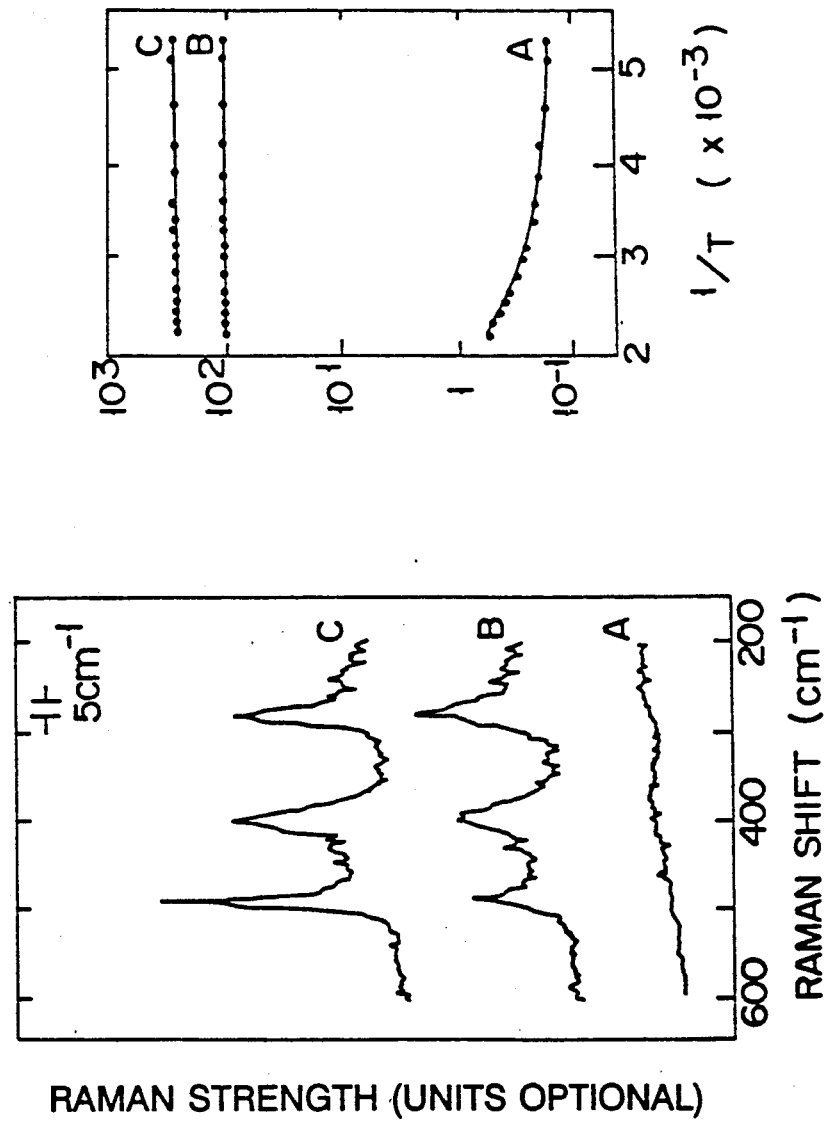
FIG. 4 compares the laser Raman spectrum of the thin film conductor according to this invention with that of a thin film resistor of a comparative example.

FIG. 4 shows an example of a laser Raman spectrum of Si-Ge alloy thin film consisting of an amorphous phase and a microcrystal phase, deposited on a glass substrate under the conditions specified in Table 1. The right-angle scattering method was used as a measuring technique to obtain data. In FIG. 4, the axis of abscissa represents Raman shift ($cm^{-1}$), and the axis of ordinates represents a Raman strength (in optimal units). The waveforms A, B, and C indicate the Raman spectra of the deposited films obtained at a discharge power of 15W, 80W and 300W. Waveform A, which has a broad pattern, indicates that the Si-Ge alloy thin film consists of a completely amorphous phase. Waveforms B and C, having sharp peaks, indicate that a microcrystal phase and an amorphous phase coexist in the alloy thin films. Since the Raman shifts in waveforms B and C have peak values which are in the neighborhoods of 290 $cm^{-1}$, 400 $cm^{-1}$ and 490 $cm^{-1}$, it is suggested that the Si-Ge alloy thin films be chiefly composed of Ge-Ge, Si-Ge and Si-Si bonds. An X-ray analysis pattern (not shown) and the Raman spectra in FIG. 4 indicates that the Si-Ge alloy thin films rarely have clusters consisting of only silicon microcrystals or germanium microcrystals, but are mainly composed of microcrystals consisting only of Si-Ge alloy.

Figure 5:
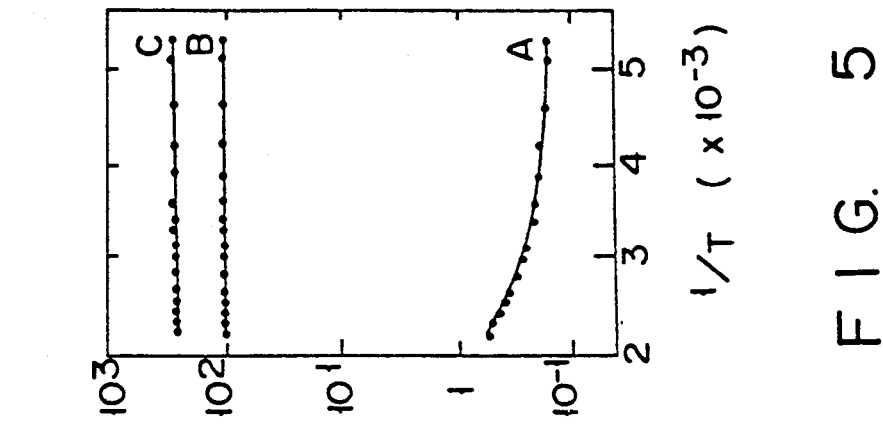
FIG. 5 compares the temperature dependency of the dark conductivity of the thin film conductor according to this invention with that of a thin film resistor of a comparative example.

FIG. 5 shows an example of the temperature characteristics of the dark-conductivity of the Si-Ge alloy thin film conductor. In FIG. 5, the axis of abscissa represents the reciprocal of the absolute temperature (1/T), and the axis of ordinates represents the dark-conductivity ($\delta_D$). Waveform A shows the temperature characteristics of the dark-conductivity of the Si-Ge alloy thin film consisting only of the amorphous phase deposited at a discharge power of 15 W. This figure shows that the dark-conductivity of the alloy thin film of waveform A is proportional to the $-\frac{1}{4}$th power of (1/T) in the low temperature range and to (1/T) in the high temperature range. From this, it is understood that the electric conduction mechanism is governed by the hopping conduction in the low temperature range and by the band conduction in the high temperature range. These temperature characteristics are the same as those of the well-known amorphous silicon film. An excellent feature of the Si-Ge alloy thin film conductor of this invention is that the measured absolute value of the dark-conductivity is three digits higher than that of the amorphous Si film. Waveforms B and C show the temperature characteristics of the dark-conductivity of two Si-Ge alloy thin films, containing microcrystals with a crystallinity of 30% and 90%, deposited at a discharge power of 80W and 300W, respectively. Of note are the features that the dark-conductivity is measured to be more than 100 $S \cdot cm^{-1}$, so high as to be equivalent to that of semimetals and that the temperature change in the dark-conductivity is so small as to be less than 1%/K. Such a stable dark-conductivity, which is only minutely affected by temperature changes, is extremely advantageous in forming thin film resistors and IC chips with high accuracy. Among Si-Ge alloy thin films having a dark-conductivity of more than 1 $S \cdot cm^{-1}$, not shown diagrammatically, which were formed under the depositing conditions in Table 1, it has been confirmed that the temperature coefficient is extremely small; less than 1%/K.

FIG. 2 shows the changes in frequency of the dark-conductivity of a Si-Ge alloy thin film formed under the depositing conditions in Table 1. In this figure, the axis of ordinates represents the dark-conductivity ratio (%), and the axis of abscissa represents the measuring frequency (Hz). The black dots indicate the frequency characteristics of a sample deposited under depositing condition A. It can be seen from the black dots that the dark conductivity begins to decrease around 200 kHz and has decreases by more than 10 percent at 4 MHz. The white dots indicate the frequency characteristics of samples deposited under depositing conditions B and C and show that the dark-conductivity is constant up to 4 MHz and begins to increase slightly at 10 MHz. This corresponds to the changes in the Si-Ge alloy thin film from the amorphous phase to the microcrystal phase as shown in FIG. 4. Hence, if the Si-Ge alloy thin film contains a microcrystal phase, the dark-conductivity of the film will remain constant within a wide range of frequencies; from direct current to high frequencies.

FIG. 1A shows an electric resistor which is made of the Si-Ge alloy thin film conductor of this invention. The figure shows an application of the electric resistor as a terminal resistor used in a wide range of frequencies, from direct current to high frequencies in coplanar microstrip lines thereon. In this electric resistor 11, provided on insulating substrate 12, is an Si-Ge alloy thin crystal film conductor 13 in which the amorphous phase and the microcrystal phase coexist as described earlier. This film conductor is in a rectangular shape indicated by width D and length L. The two first electrodes, 14A and 14B, are arranged in parallel on the insulating substrate. The first electrodes are rectangular in shape and their length is longer than the length of the Si-Ge alloy thin film conductor. First electrodes 14A and 14B are partly in contact with the two, parallel, lateral sides of the Si-Ge alloy thin film conductor. The remaining parts of the first electrodes extend beyond the Si-Ge alloy thin film conductor. Second electrode 15 is also provided on the insulating substrate and has a rectangular form and width 2d which is narrower than space D (the width of the Si-Ge alloy thin film conductor) between the first electrodes. The second electrode, being in contact with that side of the Si-Ge alloy thin film conductor which is at right angles with the sides with which the first electrodes are in contact, is located between the opposing extended parts of first electrodes 14A and 14B with clearances provided from the first electrodes. As is clear from the figure, the head ends of first electrodes 14A and 14B and second electrode 15 are on the same line. The first electrodes correspond to the external conductor of a coaxial cable and the second electrode to its internal conductor. The space D between the first electrodes and the width 2d of the second electrode determine the characteristic impedance of the cable as well as the relative dielectric constant of the substrate. The length L of the Si-Ge alloy thin film conductor, that is, the film resistor, is determined taking the attenuation factor into account. A design example is shown in the following. The sheet resistivity of a thin film conductor generally does not affect the frequency characteristics of the characteristic impedance and the attenuation factor.

However, when a design example having D=2d and L≧0.7D was analyzed using a simple model, this model did not hold at ultra high frequencies. The above frequency characteristics were determined by the properties of the resistor and the attenuation factor was more than 20 dB at ultra high frequencies.

The actual dimensions of a thin film resistor are determined by the configuration of the coaxial line used.

Generally, thin film resistors of D=3.5 mm or so are used.

FIG. 3 shows the ratio of the change in the resistance value (resistance value ratio) of the electric resistor of FIG. 1A to the change in frequency. The axis of ordinates represents the resistance value ratio (percent) and the axis of abscissa the measuring frequency (Hz). It is confirmed from this figure that the electric resistor of this invention shows an almost constant resistance value up to 32 GHz.

The above-mentioned electric resistor of this invention can be easily made of the deposition of an amorphous Si-Ge alloy thin film conductor using the plasma CVD process, a micro processing technique using photolithography and a metal film deposition technique using vapour deposition.

Metal films that can be used to constitute the first and second electrodes include an aluminium evaporated film, nichrome/gold multi-layer evaporated film and chrome/platinum multi-layer evaporated film. The chrome/platinum multi-layer evaporated film, above all else, is stable and effective at temperatures above 600° C. This is indicated in Japanese Patent Application No. 85-274390 (the Title of the Invention: Ohmic Junction Device) by the inventor of this invention. The deposition conditions of the aforementioned amorphous Si-Ge alloy thin film conductor by the plasma CVD process are governed by the flow ratio of SiH$_4$/GeH$_4$ and carrier gas (H$_2$) discharge pressure, discharge power and substrate temperature. This film can be formed under the conditions other than given in Table 1, namely, SiH$_4$/GeH$_4$=0.1 to 100, discharge pressure: 0,1 to 10 Torr, discharge power: 0.1 to 10 W./cm$^2$, substrate temperature: 300° to 500° C.

By the photo-assisted CVD process, this alloy thin film conductor can be formed at a low temperature, for example, when the substrate temperature is about 200° C.

This invention is not limited to the embodiment of FIG. 1A. As an example, the thin film conductor may be formed in a hexagon, as shown in FIG. 1B, such that inclined sides are formed between the two mutually parallel sides and the side at right angles with these two sides and the latter single side is shorter than the distance between the two parallel sides. If a device is made by making the Si-Ge alloy thin film conductor shown in FIG. 1A synmetrical about the right end of the rectangular Si-Ge alloy thin film conductor, the device produced will be a resistance attenuator. The attenuated amount of resistance is for the most part proportional to the length L but even if length L is varied, the characteristic impedance stays unchanged.

Next, an embodied example of a power detector utilizing an Si-Ge alloy thin film conductor, in which the amorphous phase and the microcrystal phase coexist, will now be described. In FIGS. 6A and 7, in the power detector, first thermocouple 24A is comprised of an Si-Ge alloy thin film conductor 22A and the metal conductor film 23A connected thereto; the second thermocouple 24B is comprised of the Si-Ge alloy thin film conductor 22B and the metal conductor film 23B connected thereto. First thermocouple 24A and second thermocouple 24B are provided in parallel on insulating substrate 21 such that the Si-Ge alloy thin film of the first thermocouple and the metal film of the second thermocouple are placed facing each other, and the Si-Ge alloy thin film of the second thermocouple and the metal film of the first thermocouple are placed facing each other. The Si-Ge alloy thin film of the first thermocouple and the metal film of the second thermocouple are bridged by first electrode 25; the metal film of the first thermocouple is connected with second electrode 26; the Si-Ge alloy thin film of the second thermocouple is connected with third electrode 27 and thereby the outputs of the two thermocouples can be put together. First, second and third electrodes 25, 26 and 27 are connected tightly with beam lead electrodes 28, 29 and 30 respectively. The desired widths of these beam lead electrodes are wider than those of the electrodes to which the beam lead electrodes are connected and are 100 to 200 μm. The desired thicknesses of the beam lead electrodes are 5 to 30 μm, and more desirably 10 to 20 μm. Gold or gold-plated platinum are the materials normally used for the beam lead electrodes. By attaching beam lead electrodes to the outer ends, that is, the cold junctions of the thermocouples as in this embodiment, the thermal resistance of the cold junction areas can be reduced considerably. In addition, by bonding the beam lead electrodes to a strip substrate, the temperature difference from the ambient temperature, that is the thermal gradient, can be minimized.

Meanwhile, the thermal resistance between the junctions of the thermocouples, that is, between the hot junction and the cold junctions is determined by the thicknesses and the widths of the insulating substrate, the Si-Ge alloy thin film conductor and the metal film. This thermal resistance is far greater than that of the cold junctions. In other words, the thermal gradient between the hot and cold junctions of the thermocouple can be increased. Therefore, by increasing the distance between the hot and cold junctions, the thermal resistance between then can be increased. As a result, the temperature difference ΔT between them is increased.

In the aforementioned power detector, constructed so that the outputs of the two thermocouples can be added, the thermoelectromotive force V can be expressed by the thermoelectric power $α_a$ of the Si-Ge alloy thin film and the thermoelectric power cm of the metal film as follows.

$$V=2(α_a+α_m)ΔT \qquad (1)$$

As is clear from this equation, the thermoelectromotive force V, that is, the detection sensitivity, increases as the temperature difference ΔT increases. Therefore, this power detector, in detecting very low power, can reduce the influence of noise and thereby improved linearity of this power detector.

In this embodiment, the Si-Ge alloy thin film and conductor film, constituting the thermocouples, are rectangular in shape, but this invention is not limited to rectangular thermocouples. To give an example, it is possible to make trapezoidal mixed crystal film and metal film such that the hot junction sides become narrower toward the cold junction sides as shown in FIG. 6B. With such trapezoidal thermocouples, the temperature between the hot and cold junctions can be changed by concentrating heat generation in the hot junction areas thereby improving detection sensitivity. Though two thermocouples were used in this power detector embodiment, the number of thermocouples may be one, three or more. A metal was used for the conductor films in this embodiment, but other types of conducting material can be used. When the Si-Ge alloy thin film is a p-type semiconductor, for example, the detection sensitivity can be improved by using an n-type semiconductor, which differs in pole of thermoelectric power, as a substitute for the conductor film.

Figure 8:
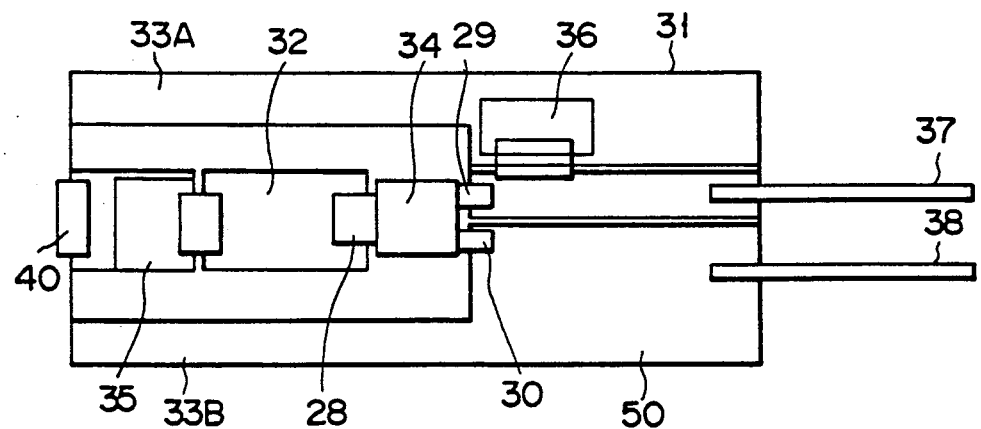
FIG. 8 is a top view example of a power detecting apparatus. The power detector according to this invention is so applied.
Figure 9:
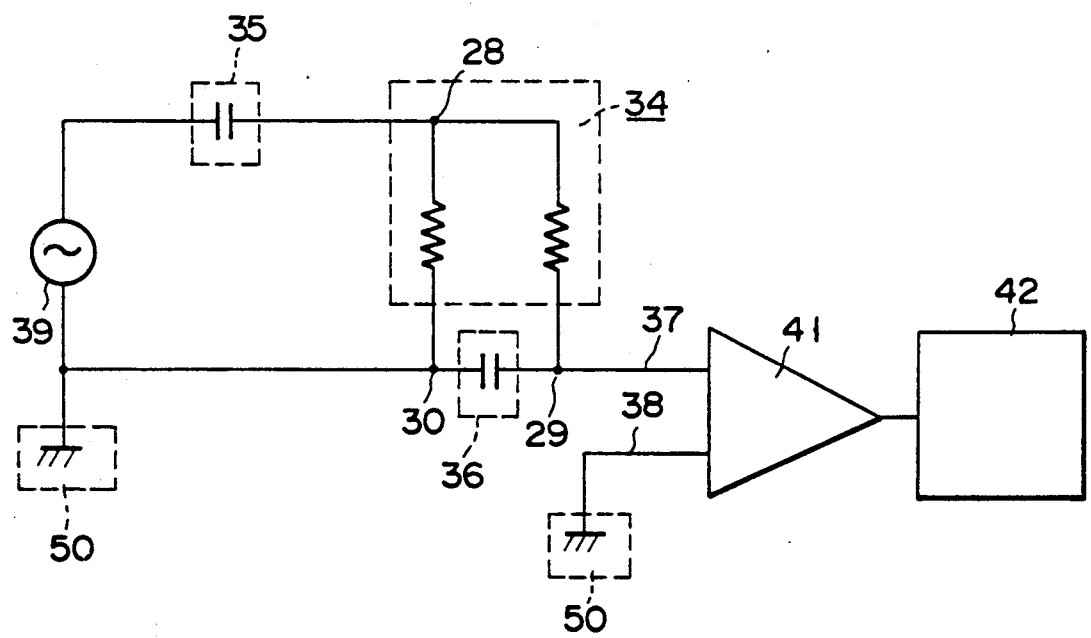
FIG. 9 is the electrical circuit diagram of the power detecting apparatus shown in FIG. 8.

FIGS. 8 and 9 show a power detection device using the power detector shown in FIG. 6A. In this device, a transmission line is made, on dielectric substrate 31, by central conductor 32 having a specified width and outer conductors 33A and 33B disposed on both sides of the device and separated by specified distances from central conductor 32. The power detector 34 has beam lead electrodes 28, 29 and 30 connected to the transmission lines, respectively, and the power being measured is supplied to the detector through the lines. Coupling capacitor 35, connected in series in the circuit, cuts off direct current but allows high frequency power to pass. Bypass capacitor 36 performs the same function as coupling capacitor 35. In this power detection device, thermo-electromotive force 37 is generated as power being measured is converted into heat. This detection output appears as direct current at beam lead electrodes 28, 29 and 30 and is taken out by lead wires 37 and 38. Numeral 40 indicates a connecting part. The d.c. output voltage is amplified by amplifier 41 and indicated at indicator 42. Numeral 50 indicates the earth connection.

Figure 10:
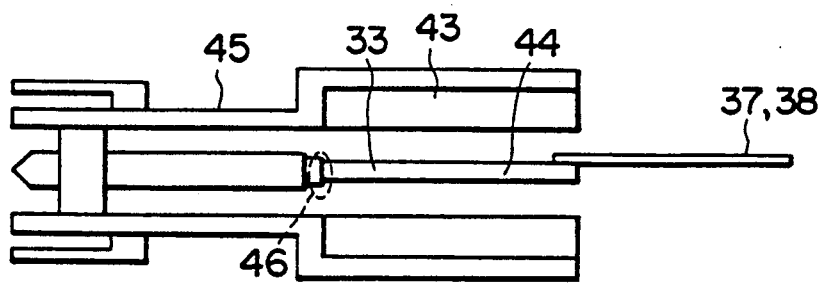
FIG. 10 shows the power detecting apparatus shown in FIG. 8 connected with a coaxial circuit.

FIG. 10 is a sectional view showing the power detection device shown in FIG. 8 being connected with a coaxial transmission line. In FIG. 10, numeral 43 indicates a hollow outer connector, into which power detection device 44 is inserted and the central conductor of coaxial transmission line 45 is connected at connecting part 46 with central conductor 33 of power detection device 44.

Figure 11:
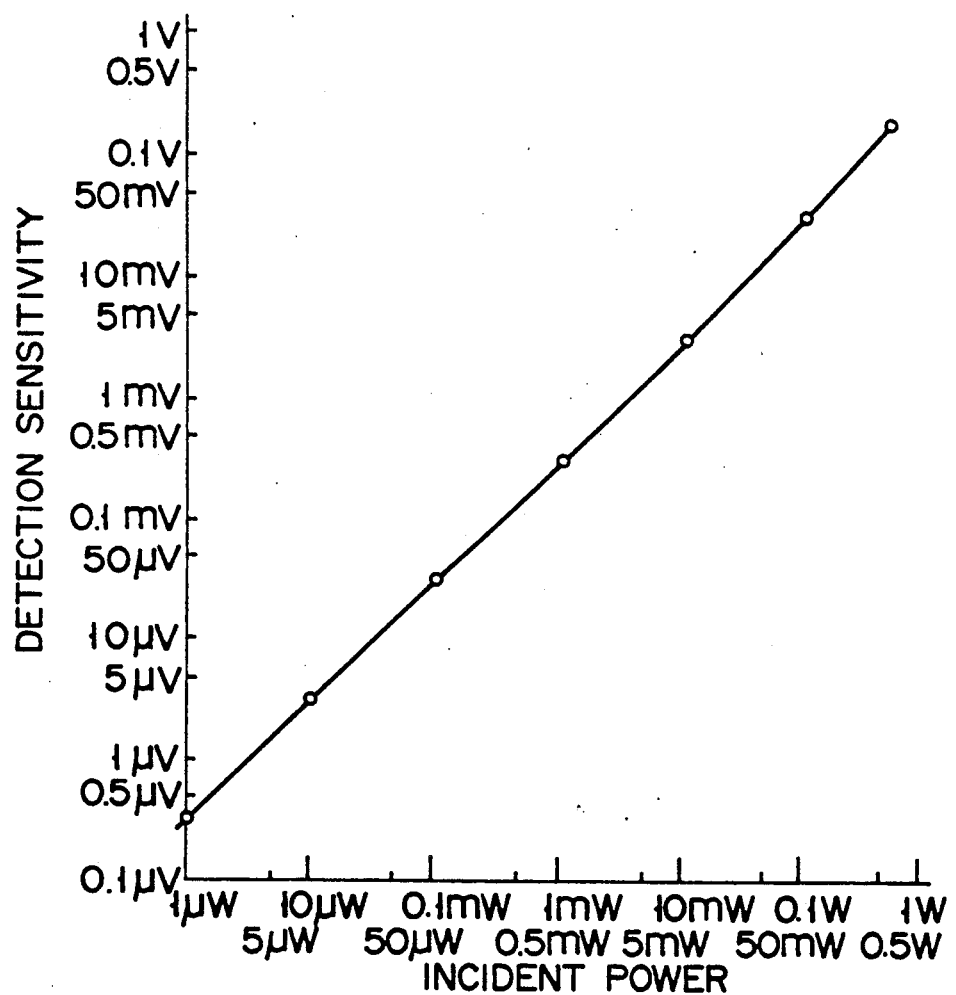
FIG. 11 is characteristic of the linearity of the detection sensitivity against the incident power obtained by the power detector of this invention.

FIG. 11 shows the linearity of the detection sensitivity in relation to the supplied power into the power detector. The axis of abscissa represents the supplied power and the axis of ordinates the detection sensitivity both in logarithmic scale.

Figure 13:
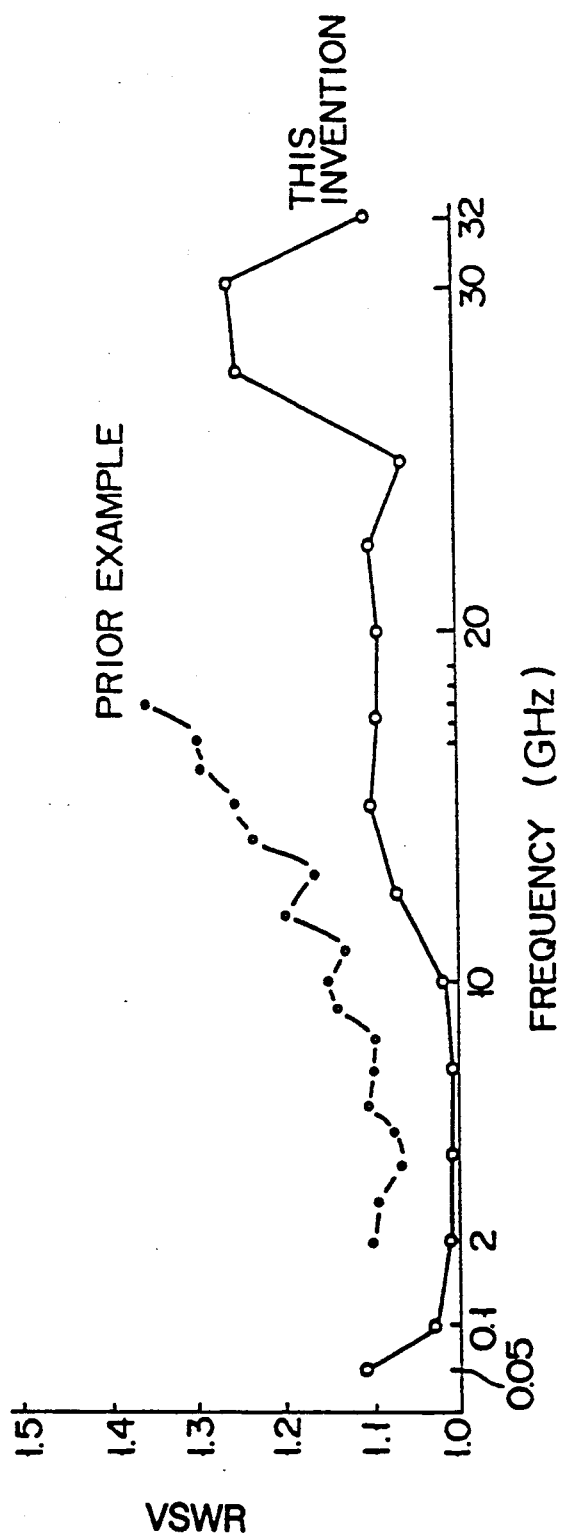
FIG. 13 shows the frequency characteristics of the power reflection coefficient obtained by the power detector of this invention.

As can be seen from this diagram, the power detection device of this invention offers excellent linearity from low power to high power. One of the reasons why data with such a good linearity was obtained with high sensitivity in detecting low power is that the thermal resistance of the thermocouples was made large by using an Si-Ge alloy thin film with a thickness of about 1 μm. FIG. 12 shows the frequency characteristics of the detection sensitivity in the power detection device of this invention. The frequency characteristics are flat; less than 1 dB up to 32 GHz. FIG. 13 shows the frequency characteristics of the VSWR (voltage standing wave ratio) in the power detector of this invention. Fine impedance matching is achieved such that the VSWR is less than 1.3 up to 32 GHz and the characteristics of the power detector of this invention are more excellent than those of the prior example indicated by the broken line in FIG. 13.

We claim:

1. An electric resistor having a thin film conductor, and which is operable in a high frequency range, the electric resistor comprising:
    an insulating substrate;
    a thin sheet-like film conductor mounted on said insulating substrate, said thin sheet-like film conductor comprising a silicon-germanium alloy film conductor in which amorphous and microcrystal phases of the alloy coexist, said thin sheet-like film conductor, as seen from a top view, having two mutually parallel sides separated by a distance, and a first side which is positioned at right angles to the two mutually parallel sides;
    a pair of first electrodes provided in parallel to each other on said insulating substrate, each of said first pair of electrodes having a rectangular shape wherein the length of the rectangle is longer than the two mutually parallel sides of said thin sheet-like film conductor, each of the pair of first electrodes having a portion in contact with a respective one of the two mutually parallel sides of said thin sheet-like film conductor and an extended portion extending in a given direction away from said thin sheet-like film conductor; and
    a second electrode disposed on said insulating substrate, between the extended portions of said pair of first electrodes and in contact with said first side of said thin sheet-like film conductor.

2. The electric resistor according to claim 1, wherein said thin sheet-like film conductor has a rectangular shape.

3. The electric resistor according to claim 1, wherein said thin sheet-like film conductor has a dark-conductivity $a_D$ of at least $1 \cdot S \text{ cm}^{-1}$ and a dark-conductivity temperature coefficient that does not exceed 1%/K.

4. The electric resistor according to claim 1, wherein the ratio of change in the resistance value of the thin sheet-like film conductor to changes in frequency is within a range of 1 dB up to 32 GHz.

5. The electric resistor according to claim 1, wherein the pair of first electrodes and the second electrode each comprise at least one evaporated film having chromium and platinum therein.

6. An electric resistor having a thin film conductor, and which is operable in a high frequency range, the electric resistor comprising:
    an insulating substrate;
    a thin sheet-like film conductor having a hexagon shape, mounted on said insulating substrate, said thin sheet-like film conductor comprising a silicon-germanium alloy film conductor in which amorphous and microcrystal phases of the alloy coexist, said hexagon shaped thin sheet-like film conductor, as seen from a top view, having two mutually parallel sides separated by a distance, and a first side which is positioned at right angles to the two mutually parallel sides;
    second and third sides of said hexagon, other than said mutually parallel side and said first side, being positioned between said two mutually parallel sides of said thin sheet-like film conductor, said second and third sides of said hexagon being inclined toward each other in a direction toward said first side;
    said first side being positioned between and in contact with said second and third sides of said hexagon that are inclined toward each other, said first side being shorter than the distances between said two mutually parallel sides;
    a pair of first electrodes provided in parallel to each other on said insulating substrate, each of said first pair of electrodes having a rectangular shape wherein the length of the rectangle is longer than the two mutually parallel sides of said thin sheet-like film conductor, each of the pair of first electrodes having a portion in contact with a respective one of the two mutually parallel sides of said thin sheet-like film conductor and an extended portion extending in a given direction away from said thin sheet-like film conductor; and a second electrode disposed on said insulating substrate, between the extended portions of said pair of first electrodes and in contact with said shorter first side of said thin sheet-like film conductor.

7. The electric resistor according to claim 6, wherein said thin sheet-like film conductor has a dark-conductivity $a_D$ of at least $1 \cdot S$ cm$^{-1}$ and a dark-conductivity temperature coefficient that does not exceed 1%/K.

8. The electric resistor according to claim 6, wherein the ratio of change in the resistance value of the thin sheet-like film conductor to changes in frequency is within a range of 1 dB up to 32 GHz.

9. The electric resistance according to claim 6, wherein the pair of first electrodes and the second electrode each comprise at least one evaporated film having chromium and platinum therein.

* * * * *

UNITED STATES PATENT AND TRADEMARK OFFICE
CERTIFICATE OF CORRECTION

PATENT NO. : 5,102,470
DATED      : April 7, 1992
INVENTOR(S) : Kodato et al

It is certified that error appears in the above-identified patent and that said Letters Patent is hereby corrected as shown below:

TITLE PAGE:

Under Section [30] Foreign Application Priority Data, insert the following:

--Oct. 27, 1986 [JP]  Japan.....61-253686--.

Signed and Sealed this

Seventh Day of September, 1993

Attest:

BRUCE LEHMAN

*Attesting Officer*     *Commissioner of Patents and Trademarks*